United States Patent
Wada et al.

(10) Patent No.: US 11,538,712 B2
(45) Date of Patent: Dec. 27, 2022

(54) SUCTION HOLDER AND HOLDING MECHANISM FOR RING FRAME

(71) Applicant: DISCO CORPORATION, Tokyo (JP)

(72) Inventors: Masahiro Wada, Tokyo (JP); Naohisa Watanabe, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/016,693

(22) Filed: Sep. 10, 2020

(65) Prior Publication Data

US 2021/0082735 A1    Mar. 18, 2021

(30) Foreign Application Priority Data

Sep. 12, 2019  (JP) .............................. JP2019-166308

(51) Int. Cl.
*B32B 43/00* (2006.01)
*H01L 21/683* (2006.01)

(52) U.S. Cl.
CPC ........ *H01L 21/6838* (2013.01); *B32B 43/006* (2013.01); *Y10T 156/1132* (2015.01); *Y10T 156/1944* (2015.01)

(58) Field of Classification Search
CPC ........... H01L 21/6838; Y10T 156/1944; Y10T 156/1132; B32B 43/006
See application file for complete search history.

(56) References Cited

U.S. PATENT DOCUMENTS

| 5,937,993 A * | 8/1999 | Sheets ................... B25B 11/005 269/21 |
| 2005/0011460 A1* | 1/2005 | Taniguchi ........... H01L 21/6838 118/728 |
| 2016/0240414 A1* | 8/2016 | Conradi .............. H01L 21/6838 |
| 2016/0268156 A1 | 9/2016 | Subrahmanyan et al. |
| 2018/0108559 A1* | 4/2018 | Balan ................ H01L 21/67288 |
| 2018/0166314 A1 | 6/2018 | Ellis et al. |
| 2018/0350632 A1* | 12/2018 | Kikumoto ............. H01L 21/681 |

FOREIGN PATENT DOCUMENTS

JP        2013082045 A        5/2013

OTHER PUBLICATIONS

Search report issued counterpart Singapore patent application No. 10202008565T, dated Jul. 16, 2021.

\* cited by examiner

*Primary Examiner* — Philip C Tucker
*Assistant Examiner* — Nickolas R Harm
(74) *Attorney, Agent, or Firm* — Greer Burns & Crain Ltd.

(57) ABSTRACT

A suction holder for sucking and holding a holding target member includes a sucker, a tube bellows connected to a lower end of the sucker, and a tube arranged inside the tube bellows and having an upper end positioned lower than an upper end of the sucker. A lower opening of the tube is communicated with a suction source and the holding target member is contacted with the upper end of the sucker to form a closed room, and the inside of the closed room is placed into a negative pressure state to hold the holding target member.

9 Claims, 6 Drawing Sheets

SUCTION HOLDER AND HOLDING MECHANISM FOR RING FRAME

BACKGROUND OF THE INVENTION

Field of the Invention

The present invention relates to a suction holder and a holding mechanism for a ring frame.

Description of the Related Art

A tape mounter that pastes a dicing tape to a ring frame and a wafer to integrate them includes a ring frame holding mechanism for holding a ring frame having an inner diameter greater than a diameter of a wafer, wafer holding means for holding the wafer at an opening portion of the ring frame, and pasting means for pasting a circular dicing tape to the ring frame and the wafer.

The ring frame holding mechanism includes suckers for sucking and holding a lower face of the ring frame, and a support table for supporting the lower face of the ring frame. The wafer holding means includes a holding table having a holding face for sucking and holding a lower face of the wafer.

In order to make the center of the wafer and the center of the opening of the ring frame coincide with each other, the ring frame holding mechanism positions the ring frame at a target position by sandwiching flat faces formed in an opposing relation on an outer periphery of the ring frame using positioning means or the like as disclosed in Japanese Patent Laid-Open No. 2013-082045. The ring frame is supported by the support table by being lifted by air jetted from the suckers until it is positioned at a predetermined position and then being held on the sucker.

The reason why the suckers are used is to prevent the lower face of the ring frame from being damaged and to make it possible to suck and hold the ring frame even if the ring frame has some slight distortion. Each sucker includes a tubular bellows in order to cope with the distortion.

SUMMARY OF THE INVENTION

However, when the ring frame is sucked to and held on the suckers and the ring frame is supported on the support table, some bellows may be recessed toward an inner side by suction force acting between the sucker and the ring frame, and even if the ring frame is released from being sucked and held, the bellows do not recover from the recess. Therefore, the bellows thereafter remain in the recessed state. This changes a height of the bellows relative to the other suckers and disables the ring frame from being lifted later.

Therefore, it is an object of the present invention to prevent, when a holding target member is to be sucked and held using a suction holder having a sucker and a bellows, the bellows from being deformed to an inappropriate shape.

In accordance with one aspect of the present invention, there is provided a suction holder for sucking and holding a holding target member, including a sucker, a tube bellows connected to a lower end of the sucker, and a tube arranged inside the tube bellows and having an upper end positioned lower than an upper end of the sucker. A lower opening of the tube is communicated with a suction source and the holding target member is contacted with the upper end of the sucker to form a closed room, an inside of which is placed into a negative pressure state to hold the holding target member.

In accordance with another aspect of the present invention, there is provided a holding mechanism for a ring frame, which sucks a lower face of a ring frame using a suction holder to hold the ring frame. The holding mechanism includes: a table; the suction holder including a sucker, a tube bellows connected to a lower end of the sucker, and a tube arranged inside the tube bellows and having an upper end positioned lower than an upper end of the sucker, the suction holder being arranged in a recessed portion formed on an upper face of the table and having an opening, the suction holder holding the ring frame by causing the upper end of the sucker to contact the ring frame; a suction path that communicates the suction holder with a suction source; a suction valve arranged in the suction path; and an air supply path that communicates the suction holder with an air supply source. An inside of the tube bellows is placed, in a state in which the ring frame is in contact with the upper end of the sucker, into a negative pressure state, so that the sucker holds the ring frame thereon and a pressure difference is generated between a pressure applied to the inside of the tube bellows and an atmospheric pressure outside the tube bellows to cause the tube bellows to be contracted by the atmospheric pressure until the tube bellows is accommodated into the recessed portion.

In the one aspect and the another aspect of the present invention, since the tube is arranged inside the tube bellows, when the tube bellows is about to be recessed, the tube bellows is supported by the tube and is suppressed from being deformed into an inappropriate shape. Consequently, heights of the plurality of suckers do not become different from each other, and consequently, the ring frame can be lifted and positioned appropriately. Then, the thus positioned ring frame can be sucked and held.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

1. Configuration of Ring Frame Holding Mechanism

Figure 1:
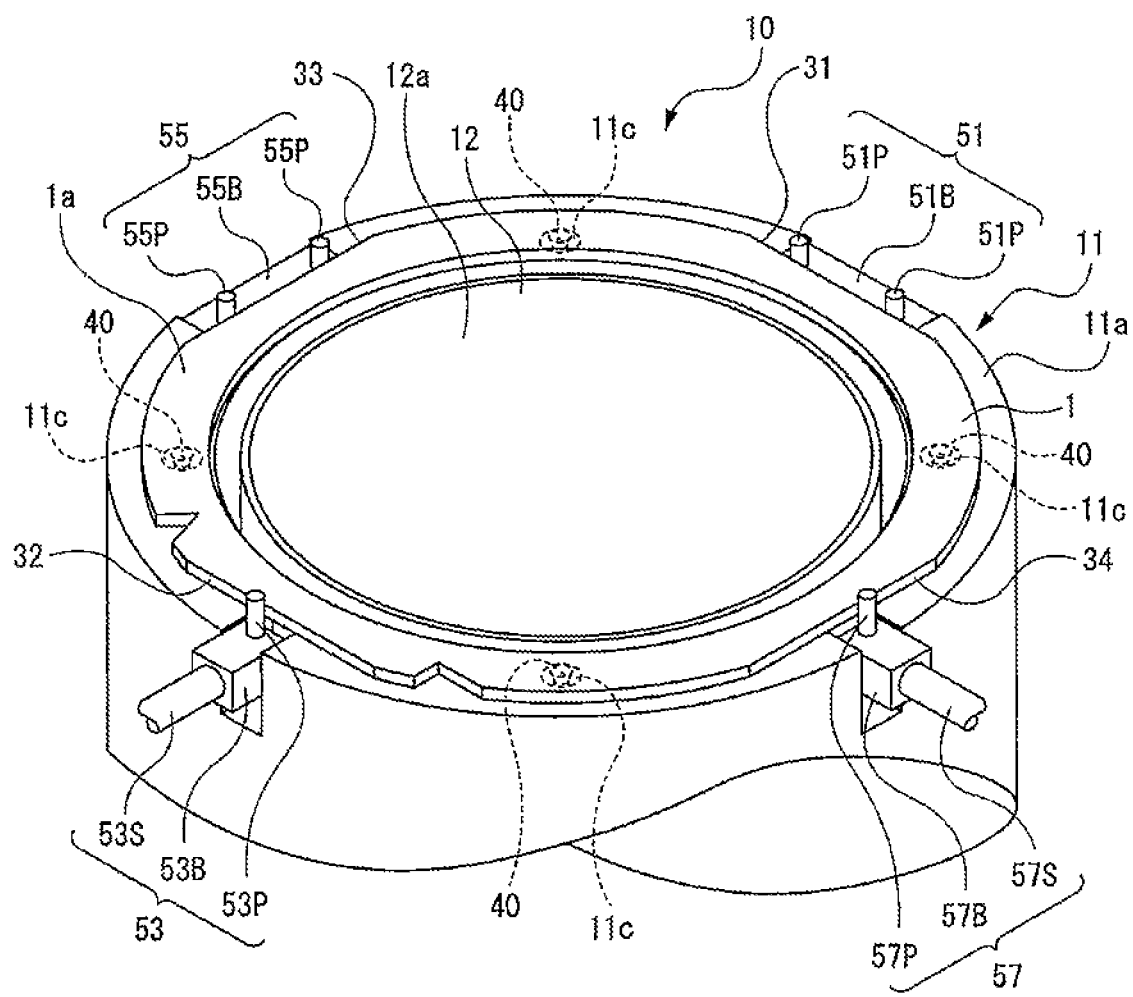
FIG. 1 is a perspective view depicting an entire ring frame holding mechanism.

As depicted in FIG. 1, a ring frame holding mechanism 10 is a holding mechanism for holding a ring frame 1. The ring frame 1 is pasted to an adhesive tape not depicted together with, for example, a wafer or the like not depicted, so that the ring frame 1 and the wafer or the like are integrated with each other to enhance the handling performance of the wafer or the like.

The ring frame 1 has a first flat face 31 and a second flat face 32 extending in parallel to each other and a third flat face 33 and a fourth flat face 34 extending in a direction orthogonal to the first flat face 31 and the second flat face 32. The four flat faces 31 to 34 are provided on an outer periphery of the ring frame 1.

In the following, the ring frame holding mechanism 10 is described.

As depicted in FIG. 1, the ring frame holding mechanism 10 includes a holding table 12. The holding table 12 has an upper face that serves as a holding face 12a on which a wafer or the like is to be held.

The ring frame holding mechanism 10 includes a ring-shaped table 11. The ring-shaped table 11 surrounds the holding table 12, and a plurality of (in FIG. 1, four) recessed portions 11c having an opening are formed on an upper face 11a of the ring-shaped table 11.

The ring frame holding mechanism 10 includes, for example, a first fixed positioning portion 51 and a first movable positioning portion 53 arranged so as to oppose each other, and a second fixed positioning portion 55 and a second movable positioning portion 57 arranged so as to oppose each other. For example, a direction in which the first fixed positioning portion 51 and the first movable positioning portion 53 oppose each other and a direction in which the second fixed positioning portion 55 and the second movable positioning portion 57 oppose each other are orthogonal to each other.

The first fixed positioning portion 51 includes a first fixed member 51B fixed to the ring-shaped table 11 and two first fixed pins 51P attached to the first fixed member 51B.

The first movable positioning portion 53 that opposes the first fixed positioning portion 51 includes a first movable member 53B, one first movable pin 53P attached to the first movable member 53B, and a first shaft 53S extending in a diametrical direction of the ring-shaped table 11 through the first movable member 53B. The first movable member 53B is movable in a diametrical direction of the ring-shaped table 11 along the first shaft 53S.

Similarly, the second fixed positioning portion 55 includes a second fixed member 55B fixed to the ring-shaped table 11, and two second fixed pins 55P attached to the second fixed member 55B.

The second movable positioning portion 57 that opposes the second fixed positioning portion 55 includes a second movable member 57B, a single second movable pin 57P attached to the second movable member 57B, and a second shaft 57S extending in a diametrical direction of the ring-shaped table 11 through the second movable member 57B. The second movable member 57B is movable in the diametrical direction of the ring-shaped table 11 along the second shaft 57S.

In the first movable positioning portion 53, for example, a spring mechanism or the like not depicted is arranged, for example, inside the first movable member 53B. For example, if the first movable pin 53P is pushed from a +Z direction, then the first movable pin 53P is moved down in a −Z direction to be accommodated in the first movable member 53B by such a spring mechanism or the like as described above. Further, if the pressing force applied from the +Z direction side to the first movable pin 53P is cancelled, then the first movable pin 53P accommodated in the first movable member 53B is moved upwardly in the +Z direction to be projected upwardly from the ring-shaped table 11 again. In FIG. 1, no such pressing force as described above is applied to the first movable pin 53P, and the first movable pin 53P projects upwardly from the ring-shaped table 11.

Similarly, also in the second movable positioning portion 57, the second movable pin 57P is movable upwardly and downwardly, for example, by a spring mechanism or the like not depicted arranged inside the second movable member 57B.

In a state in which the ring frame 1 is placed on the upper face 11a of the ring-shaped table 11, the ring frame 1 is positioned on and fixed to the upper face 11a of the ring-shaped table 11, for example, by being held at the first flat face 31 and the second flat face 32 by and between the first fixed positioning portion 51 and the first movable positioning portion 53.

Figure 2:
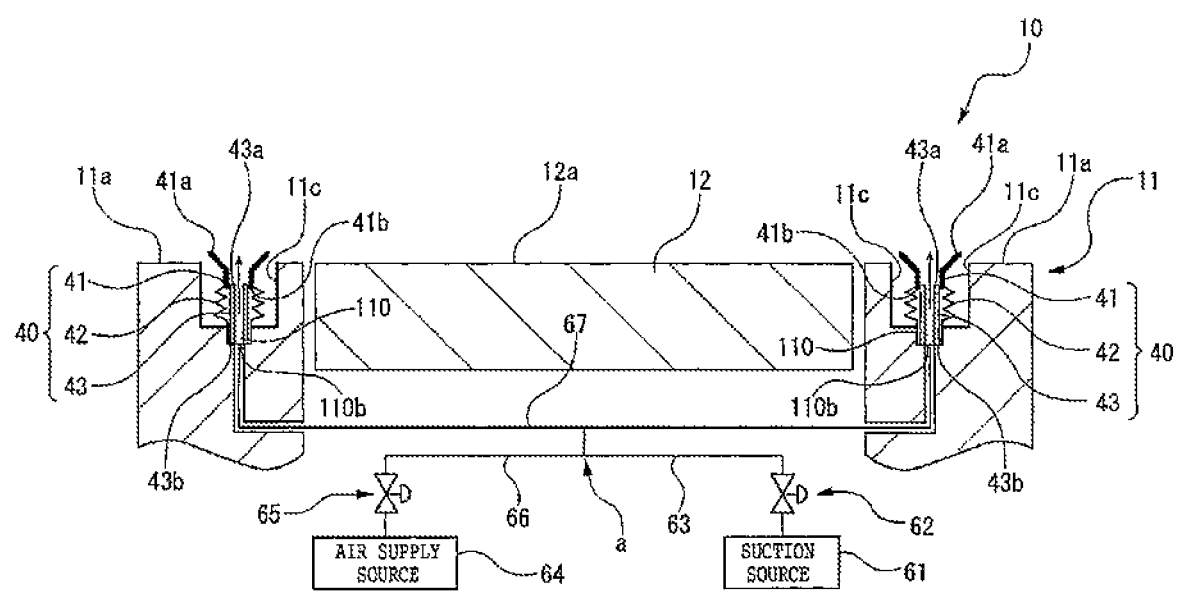
FIG. 2 is a sectional view depicting the ring frame holding mechanism as viewed from a side.

As depicted in FIG. 2, in a bottom of each recessed portion 11c formed on the ring-shaped table 11, a hole 110b smaller than the recessed portion 11c is formed.

A suction holder 40 is placed in the recessed portion 11c.

The suction holder 40 includes a sucker 41. The ring frame 1 can be placed on the sucker 41.

The suction holder 40 includes a tube bellows 42 expandable and contractible in the Z axis directions. The tube bellows 42 is connected to a lower end 41b of the sucker 41.

The suction holder 40 includes a hollow cylindrical tube 43. The tube 43 is arranged inside the tube bellows 42 and is connected at a lower opening 43b thereof to the hole 110b.

Further, an upper end 43a of the tube 43 is positioned lower than the upper face 11a of the ring-shaped table 11. A heightwise position of the upper end 43a of the tube 43 and a heightwise position of the upper end 41a of the sucker 41 have a positional relation adjusted such that, for example, even if the ring frame 1 is sucked to and held on the sucker 41 to contract the tube bellows 42, the heightwise position of the upper end 43a of the tube 43 does not become higher than the heightwise position of the upper end 41a of the sucker 41.

Below the holding table 12, a suction source 61, a suction path 63 connected to the suction source 61, and a suction valve 62 for switching a communication state between the suction source 61 and the suction path 63 are arranged. Further, below the holding table 12, an air supply source 64, an air supply path 66 connected to the air supply source 64, and an air valve 65 for switching a communication state between the air supply source 64 and the air supply path 66 are arranged.

The suction path 63 and the air supply path 66 merge at a merging point a and are connected to a common path 67. The common path 67 is connected to the holes 110b.

For example, if, in a state in which the suction valve 62 is open and besides the air valve 65 is closed, a suction force is exerted by the suction source 61, then the exerted suction force is transmitted to the common path 67 through the suction path 63 and is transmitted to the hole 110b through the common path 67. Then, the suction force is transmitted to an inside of the tube 43 from the lower opening 43b of the tube 43 connected to the hole 110b and is transmitted to an upper side of the ring-shaped table 11 from the upper end 43a of the tube 43.

On the other hand, for example, if, in a state in which the suction valve 62 is closed and besides the air valve 65 is open, the air supply source 64 is rendered operative to supply air, then the air supplied is transmitted to the common path 67 through the air supply path 66 and is further transmitted to the hole 110b through the common path 67. Then, the air is transmitted to the inside of the tube 43 from the lower opening 43b of the tube 43 connected to the hole 110b and is supplied to the upper side of the ring-shaped table 11.

Figure 3:
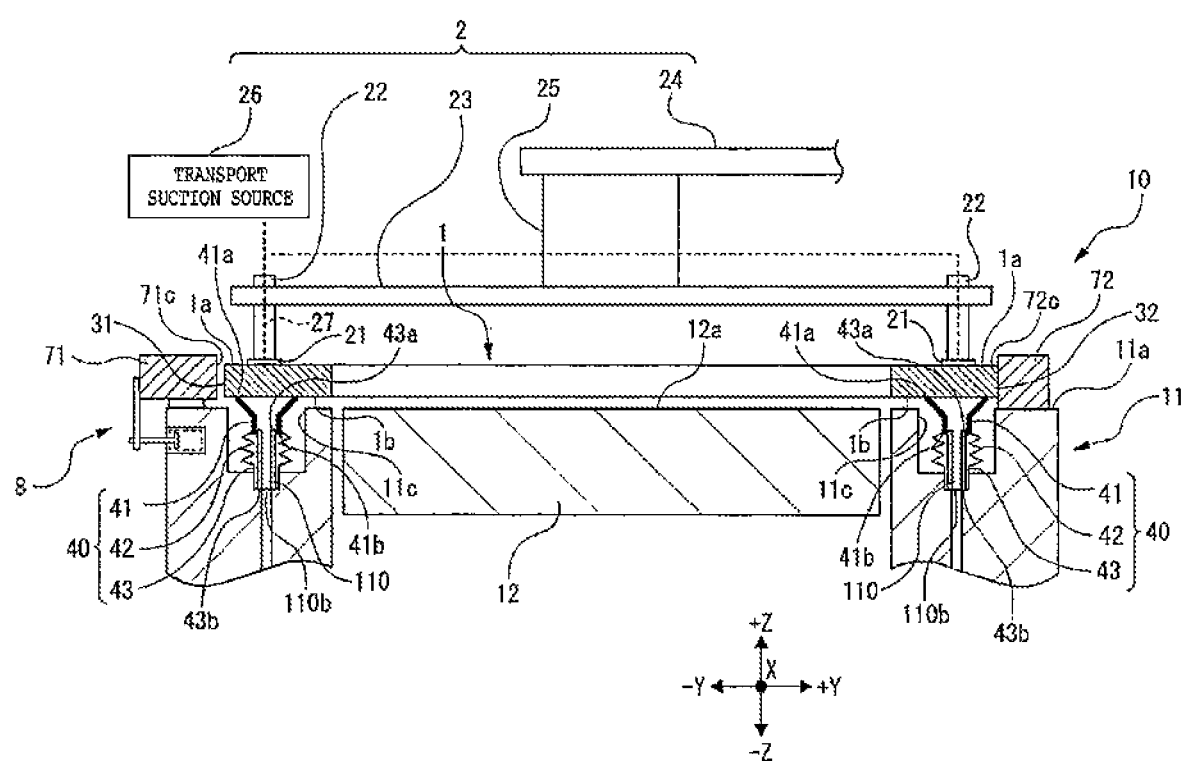
FIG. 3 is a sectional view illustrating a manner in which a ring frame is transported to the ring frame holding mechanism using a transport mechanism as viewed from a side.

As depicted in FIG. 3, the ring frame holding mechanism 10 may include, for example, a first block 71 and a second block 72 in place of the first fixed positioning portion 51, the first movable positioning portion 53, the second fixed positioning portion 55, and the second movable positioning portion 57.

The first block 71 is connected to a cylinder mechanism 8, and the first block 71, the second block 72, and the cylinder mechanism 8 have a function for performing positioning of the ring frame 1.

For example, if, in a state in which the ring frame 1 is placed on the ring-shaped table 11, the first block 71 is moved toward a diametrical direction (+Y direction) of the ring frame 1 using the cylinder mechanism 8, then it is possible to bring a side face 71c of the first block 71 and a side face 72c of the second block 72 into contact with the first flat face 31 and the second flat face 32, respectively, to sandwich the ring frame 1 at the first flat face 31 and the second flat face 32 from outer sides. The ring frame 1 can be positioned on the ring-shaped table 11 by suitably adjusting the position of the first block 71 using the cylinder mechanism 8.

It is to be noted that, also in a direction orthogonal to a direction in which the side face 71c of the first block 71 and the side face 72c of the second block 72 oppose each other, two blocks, a cylinder mechanism, and so forth having the function for positioning the ring frame 1 similarly may be arranged.

In a proximity of the ring frame holding mechanism 10, a transport mechanism 2 is arranged which has, for example, a function for carrying in the ring frame 1 to the upper side of the ring-shaped table 11 and carrying out the ring frame 1 from the upper side of the ring-shaped table 11. The transport mechanism 2 includes, for example, a plurality of suction portions 21 for sucking the ring frame 1, a plurality of holding members 22 for individually holding the suction portions 21, a support portion 23 for supporting the plurality of holding members 22, an arm portion 24 connected to a driving source (not depicted), and a connection member 25 that connects the support portion 23 and the arm portion 24 to each other. A communication path 27 is formed inside each of the suction portions 21 and is connected to a transport suction source 26.

If the transport suction source 26 is rendered operative so as to exert suction force in a state in which a lower face of the suction portion 21 and an upper face 1a of the ring frame 1 contact with each other, then the exerted suction force is transmitted to the lower face of the suction portion 21 through the communication path 27. Consequently, the suction portions 21 can suck and hold the ring frame 1.

If the arm portion 24 is moved by moving means or the like not depicted in the state in which the ring frame 1 is sucked to and held on the suction portions 21, then the transport mechanism 2 can carry in the ring frame 1 to the upper face 11a of the ring-shaped table 11 and carry out the ring frame 1 from the upper face 11a of the ring-shaped table 11.

2. Operation of Ring Frame Holding Mechanism

Operation of the ring frame holding mechanism 10 when the ring frame 1 is held using the ring frame holding mechanism 10 described above is described.

First, the ring frame 1 is carried to the upper side of the ring-shaped table 11 using the transport mechanism 2 and is placed on the ring-shaped table 11 as depicted in FIG. 3. In the state in which the ring frame 1 is placed on the ring-shaped table 11, a lower face 1b of the ring frame 1 contacts the upper end 41a of the suckers 41 projecting from the recessed portions 11c of the ring-shaped table 11.

Figure 4:
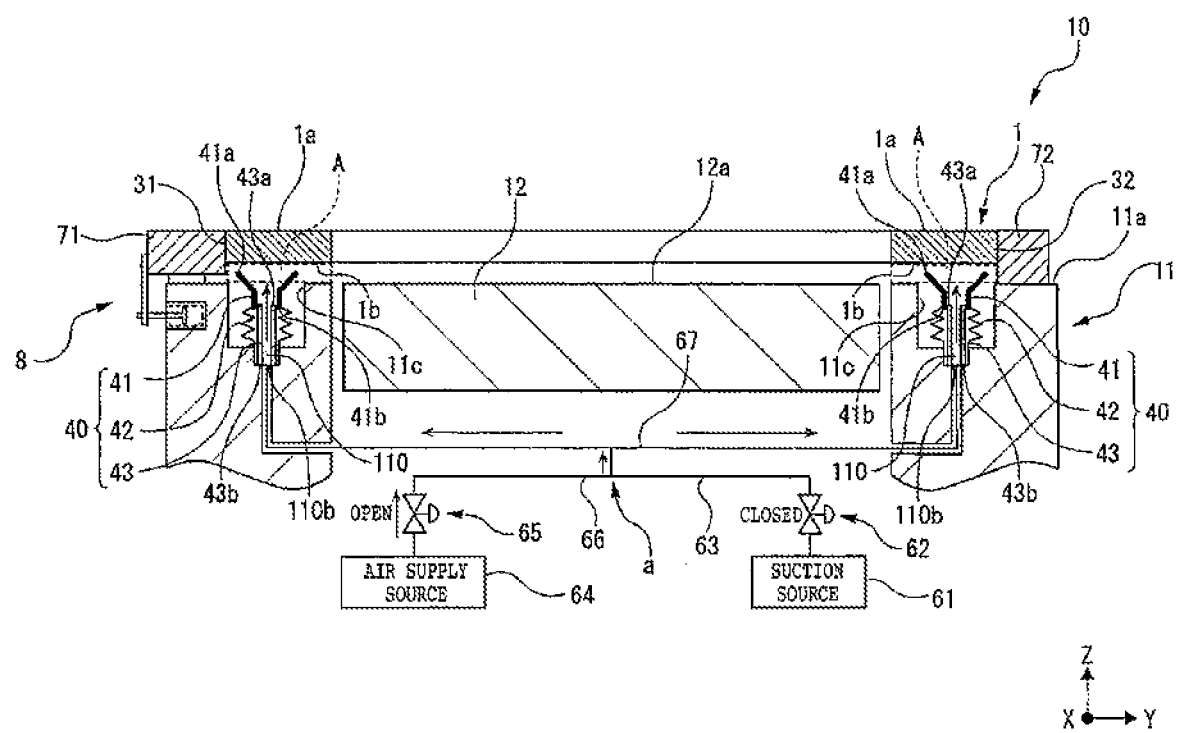
FIG. 4 is a sectional view illustrating a manner in which an air layer is formed between the ring frame and a sucker as viewed from a side.

Then, the suction valve 62 is closed and the air valve 65 is opened, and then the air supply source 64 is rendered operative as depicted in FIG. 4. Consequently, air supplied from the air supply source 64 is transmitted from the air supply path 66 to the common path 67 and then transmitted to each hole 110b. The air transmitted to each hole 110b is supplied from the lower opening 43b of the tube 43 connected to the hole 110b to the inside of the tube 43 and then supplied to an upper side of the sucker 41.

When the air is supplied to the upper side of the sucker 41, the ring frame 1 is biased upwardly from the lower face 1b side thereof and an air layer A is formed between the upper end 41a of the sucker 41 and the lower face 1b of the ring frame 1.

In the state in which the air layer A is formed been the upper end 41a of the sucker 41 and the lower face 1b of the ring frame 1, for example, the cylinder mechanism 8 is used to move the first block 71 toward the diametrical direction (+Y direction) of the ring frame 1. Consequently, the side face 71c of the first block 71 is brought into contact with the first flat face 31. Furthermore, the first block 71 is transversely slipped in the +Y direction until the side face 72c of the second block 72 is brought into contact with the second flat face 32, thereby to sandwich the ring frame 1 at the first flat face 31 and the second flat face 32 from the outer sides. If, in this state, the position of the first block 71 is suitably adjusted using the cylinder mechanism 8, then positioning of the ring frame 1 on the ring-shaped table 11 is performed.

Figure 5:
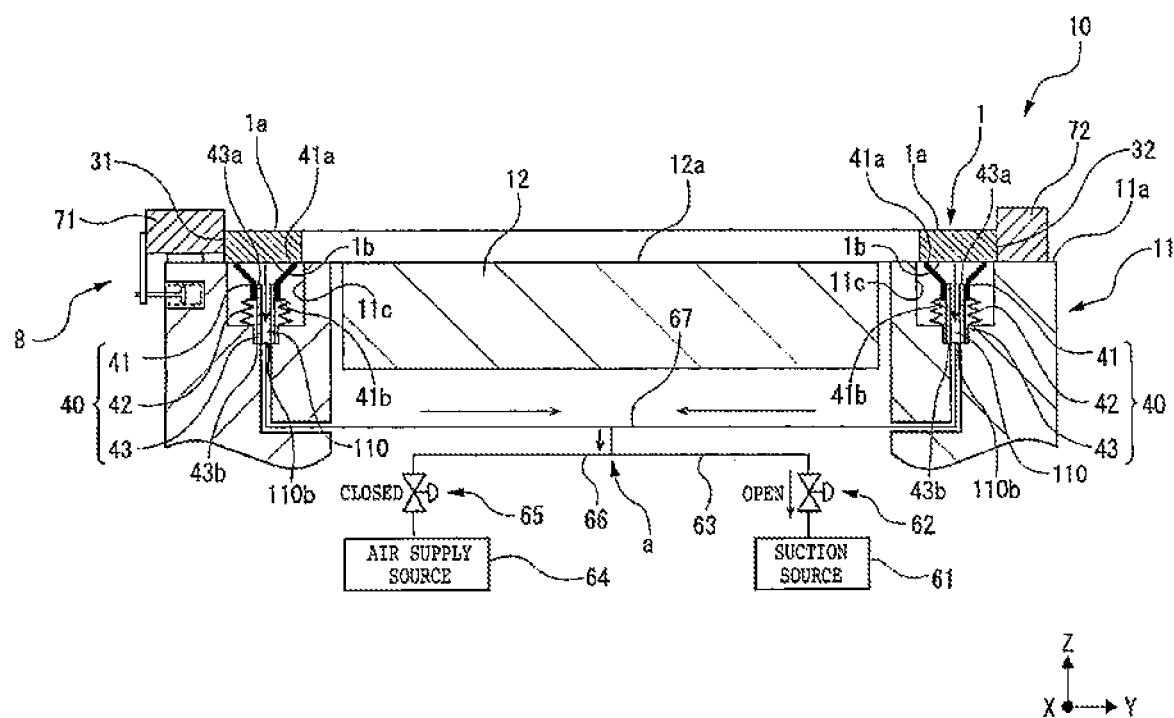
FIG. 5 is a sectional view illustrating a manner in which the ring frame is sucked to and held on the sucker as viewed from a side.

Then, the operation of the air supply source 64 is stopped to stop the supply of air to the upper side of the sucker 41. Consequently, the air layer A formed between the upper end 41a of the sucker 41 and the lower face 1b of the ring frame 1 disappears, and the lower face 1b of the ring frame 1 and the upper end 41a of the sucker 41 are brought into contact with each other as depicted in FIG. 5.

Thereafter, the air valve 65 is closed and the suction valve 62 is opened, and then the suction source 61 is rendered operative to exert suction force. Consequently, suction force exerted by the suction source 61 is transmitted to the common path 67 through the suction path 63 and then to each hole 110b. Then, the suction force is transmitted from the lower opening 43b of the tube 43 connected to the hole 110b to the inside of the tube 43 and then transmitted from the upper end 43a of the tube 43 to the lower face 1b of the ring frame 1.

In this manner, in the state in which the lower face 1b of the ring frame 1 is in contact with the upper end 41a of the sucker 41, the inside of the tube bellows 42 is placed into a negative pressure state, thereby to cause a pressure difference between a pressure applied to the inside of the tube bellows 42 and an atmospheric pressure outside the tube bellows 42. Consequently, the ring frame 1 is sucked to and held on the suckers 41, and the tube bellows 42 are contracted by the atmospheric pressure to accommodate the suckers 41 in the recessed portions 11c.

While each tube bellows 42 is being contracted, the tube bellows 42 is guided by the tube 43 arranged inside the tube bellows 42, thereby to prevent the tube bellows 42 from being deformed in a direction orthogonal to the contraction direction of the tube bellows 42. Accordingly, it becomes possible to lift the ring frame 1 and perform positioning without making the heights of the plurality of suckers 41 different from each other. Then, it becomes possible to suck and hold the ring frame 1 positioned in this manner.

Figure 6:
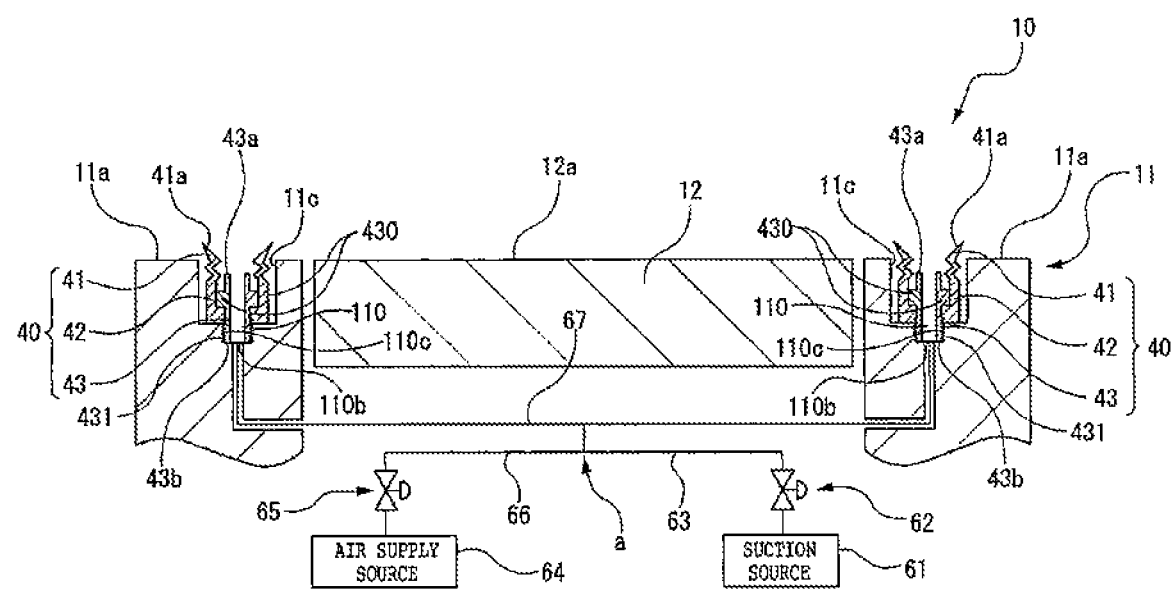
FIG. 6 is a sectional view depicting, as viewed from a side, the ring frame holding mechanism in a case where a suction holder arranged on the ring frame holding mechanism is a bellows pad in which a sucker and a tubular bellows are integrated and a tube provided inside the tubular bellows has a flange portion.

It is to be noted that each of the suction holders 40 provided in the ring frame holding mechanism 10 may be a so-called bellows pad in which, for example, the sucker 41 and the tube bellows 42 are integrated with each other as depicted in FIG. 6.

A substantially cylindrical tube 43 is arranged inside the tube bellows 42, and a male thread 431 is formed at a lower portion of a side wall of the tube 43. A female thread 110c corresponding to the male thread 431 is formed in the hole 110b, and the male thread 431 of the tube 43 is screwed with the female thread 110c to fix the tube 43 to the hole 110b.

For example, a flange portion 430 is formed on a side face of the tube 43 such that it is swollen toward a diametrical direction of the tube 43.

The male thread 431 of the tube 43 is screwed with the female thread 110c, and the tube bellows 42 is sandwiched by and between the flange portion 430 and the bottom of the recessed portion 11c to fix the tube bellows 42 to the recessed portion 11c. Further, as described above, if the inside of the tube bellows 42 is placed into a negative pressure state using the suction source 61 in the state in which the ring frame 1 is placed on the sucker 41, then the ring frame 1 is sucked to and held on the sucker 41 to contract the tube bellows 42. At this time, since an inner wall of the tube bellows 42 fixed by the flange portion 430 is pressed by the upper end 43a of the tube 43, the tube bellows 42 can be prevented from being deformed in the direction orthogonal to the contraction direction of the tube bellows 42 by the atmospheric pressure.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A suction holder provided within a recessed portion on an upper face of a table for sucking and holding a holding target member on the upper face of the table, comprising:
    a sucker;
    an expandable and contractible tube bellows having a top end connected to a lower end of the sucker and a lower end extending to a bottom of the recessed portion; and
    a tube arranged inside the tube bellows and having an upper end positioned lower than an upper end of the sucker and the upper face of the table and a lower end attached to the bottom of the recessed portion, wherein
    a lower opening at the lower end of the tube is communicated with a suction source and the holding target member is contacted with the upper end of the sucker to form a closed room, an inside of which is placed into a negative pressure state to hold the holding target member, and
    the tube bellows are configured to be guided by the tube to expand and contract along a lenght of the tube.

2. The suction holder as defined in claim 1, wherein the lower opening of the tube is selectively communicated with the suction source and an air supply source.

3. The suction holder as defined in claim 1, wherein the tube bellows contracts when the closed room is placed into the negative pressure state to hold the holding target member.

4. The suction holder as defined in claim 1, wherein the tube prevents the tube bellows from being deformed in a direction orthogonal to a contraction direction of the tube bellows.

5. A holding mechanism for a ring frame, which sucks a lower face of a ring frame using a suction holder to hold the ring frame, the holding mechanism comprising:
    a table having a recessed portion formed on an upper face of the table and having an opening;
    the suction holder arranged in the recessed portion of the table and including a sucker, an expandable and contractible tube bellows having a top end connected to a lower end of the sucker and a lower end extending to a bottom of the recessed portion, and a tube arranged inside the tube bellows and having an upper end positioned lower than an upper end of the sucker and the upper face of the table and a lower end attached to the bottom of the recessed portion, the suction holder holding the ring frame by causing the upper end of the sucker to contact the ring frame;
    a suction path that communicates the suction holder with a suction source;
    a suction valve arranged in the suction path; and
    an air supply path that communicates the suction holder with an air supply source, wherein
    an inside of the tube bellows is placed, in a state in which the ring frame is in contact with the upper end of the sucker, into a negative pressure state, so that the sucker holds the ring frame thereon and a pressure difference is generated between a pressure applied to the inside of the tube bellows and an atmospheric pressure outside the tube bellows to cause the tube bellows to be contracted by the atmospheric pressure until the tube bellows is accommodated into the recessed portion, and
    the tube bellows are configured to be guided by the tube to expand and contract along a lenght of the tube.

6. A suction holder for sucking and holding a holding target member on a table, comprising:
    a sucker;
    a tube bellows connected to a lower end of the sucker; and
    a tube arranged inside the tube bellows and having an upper end positioned lower than an upper end of the sucker and having a flange portion formed on a side face of the tube and configured to hold the tube bellows, wherein
    a lower opening of the tube is communicated with a suction source and the holding target member is contacted with the upper end of the sucker to form a closed room, an inside of which is placed into a negative pressure state to hold the holding target member.

7. The suction holder as defined in claim 6, wherein a thread is formed on a bottom portion of the tube and configured to be screwed into a hole in a bottom of a recessed portion in the table.

8. The suction holder as defined in claim 6, wherein the lower opening of the tube is selectively communicated with the suction source and an air supply source.

9. The suction holder as defined in claim 6, wherein the tube bellows has a pad formed at a lower end, and the flange portion formed on a side face of the tube is configured to hold the pad between the flange portion and a bottom of a recessed portion in the table.

* * * * *

UNITED STATES PATENT AND TRADEMARK OFFICE
CERTIFICATE OF CORRECTION

| | |
|---|---|
| PATENT NO. | : 11,538,712 B2 |
| APPLICATION NO. | : 17/016693 |
| DATED | : December 27, 2022 |
| INVENTOR(S) | : Wada et al. |

It is certified that error appears in the above-identified patent and that said Letters Patent is hereby corrected as shown below:

In the Claims

Column 7, Line 67, delete "lenght" and insert --length-- therefor.

Column 8, Line 44, delete "lenght" and insert --length-- therefor.

Column 9, Line 3, delete "a bottom of a recessed portion in the table" and insert --the bottom of the recess-- therefor.

Signed and Sealed this
Fourteenth Day of February, 2023

Katherine Kelly Vidal
*Director of the United States Patent and Trademark Office*